(12) United States Patent
Likhanskii et al.

(10) Patent No.: US 9,613,777 B2
(45) Date of Patent: Apr. 4, 2017

(54) UNIFORMITY CONTROL USING ADJUSTABLE INTERNAL ANTENNAS

(71) Applicant: Varian Semiconductor Equipment Associates, Inc., Gloucester, MA (US)

(72) Inventors: Alexandre Likhanskii, Malden, MA (US); Svetlana B. Radovanov, Brookline, MA (US)

(73) Assignee: Varian Semiconductor Equipment Associates, Inc.

( * ) Notice: Subject to any disclaimer, the term of this patent is extended or adjusted under 35 U.S.C. 154(b) by 218 days.

(21) Appl. No.: 14/484,018

(22) Filed: Sep. 11, 2014

(65) Prior Publication Data
US 2016/0079042 A1    Mar. 17, 2016

(51) Int. Cl.
*H01J 37/32* (2006.01)
*H01J 37/02* (2006.01)
*H01J 37/08* (2006.01)

(52) U.S. Cl.
CPC ............ *H01J 37/023* (2013.01); *H01J 37/08* (2013.01); *H01J 37/321* (2013.01); *H01J 37/3211* (2013.01); *H01J 37/32174* (2013.01); *H01J 2237/061* (2013.01); *H01J 2237/0817* (2013.01)

(58) Field of Classification Search
None
See application file for complete search history.

(56) References Cited

U.S. PATENT DOCUMENTS

| | | | | |
|---|---|---|---|---|
| 5,629,918 A | * | 5/1997 | Ho | H02K 57/00 216/22 |
| 6,028,285 A | * | 2/2000 | Khater | H01J 37/321 118/723 I |
| 6,158,384 A | | 12/2000 | Ye et al. | |
| 6,436,252 B1 | * | 8/2002 | Tzatzov | C23C 14/046 204/192.12 |
| 6,783,629 B2 | * | 8/2004 | Glukhoy | H01J 37/32082 118/723 E |

(Continued)

OTHER PUBLICATIONS

Jong Hyeuk Lim, et al., Characteristics of Inductively Coupled Plasma Using Internal Double Comb-type Antenna for Flat Panel Display Processing, Japanese Journal of Applied Physics, 2007, pp. 1216 to 1218, vol. 46, The Japan Society of Applied Physics.

*Primary Examiner* — Douglas W Owens
*Assistant Examiner* — Srinivas Sathiraju

(57) ABSTRACT

A plasma chamber having improved plasma density is disclosed. The plasma chamber utilizes internal antennas. These internal antennas can be manipulated in a variety of ways to control the uniformity of the plasma density. In some embodiments, the conductive coil within the antenna is translated from a first location to a second location. For example, the entirety of the internal antennas may be translated within the plasma chamber. In another embodiment, the conductive coil disposed within the outer tube is translated relative to its outer tube. In another embodiment, the conductive coil within the outer tube may be bent and may be rotated within the outer tube. In another embodiment, the outer tube may also be bent and rotated. In other embodiments, ferromagnetic segments may be disposed in the outer tube to focus or block the electromagnetic energy emitted from the conductive coil.

19 Claims, 8 Drawing Sheets

(56) References Cited

U.S. PATENT DOCUMENTS

| | | | |
|---|---|---|---|
| 7,183,716 B2* | 2/2007 | Kanarov | H01J 27/18 118/723 I |
| 7,845,310 B2 | 12/2010 | Divergilio et al. | |
| 8,444,806 B2 | 5/2013 | Miyake et al. | |
| 2004/0178056 A1* | 9/2004 | De Bosscher | H01J 37/3405 204/192.12 |
| 2012/0217876 A1* | 8/2012 | Diamant | F03H 1/0068 315/111.41 |
| 2014/0028190 A1* | 1/2014 | Voronin | H05H 1/46 315/111.21 |
| 2014/0042337 A1 | 2/2014 | Biloiu et al. | |

* cited by examiner

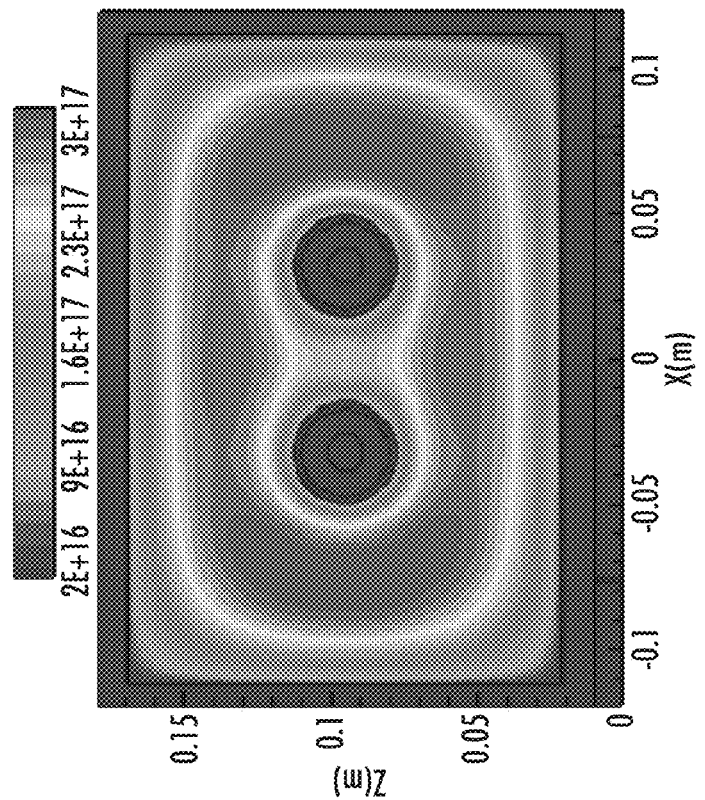
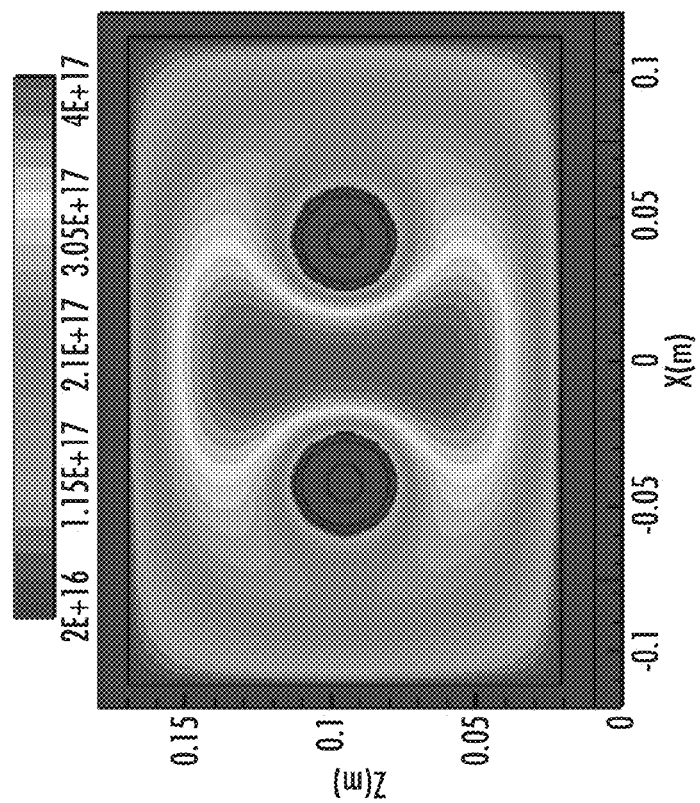

UNIFORMITY CONTROL USING ADJUSTABLE INTERNAL ANTENNAS

FIELD

Embodiments of this disclosure are directed to systems for controlling plasma uniformity, specifically plasma chambers having internal antennas.

BACKGROUND

Plasma chambers are often used to generate a plasma. Ions from this plasma are then extracted from the plasma chamber through an aperture to form an ion beam. This plasma may be generated in various ways. In one embodiment, an antenna is disposed outside the plasma chamber, proximate to a dielectric window. The antenna is then excited using an RF power supply. The electromagnetic energy generated by the antenna then passes through the dielectric window to excite feed gas disposed within the plasma chamber.

In another embodiment, the antennas may be disposed within the plasma chamber, and may be referred to as internal antennas. Like the previous embodiment, an RF power supply is electrically coupled to the internal antennas. These internal antennas may include an outer tube, which may be quartz or another dielectric material. An electrically conductive coil is disposed within and usually spaced apart from the outer tube. The RF power supply is electrically coupled to the coil, which emits electromagnetic energy through the outer tube, generating a plasma within the plasma chamber.

However, the plasma that is generated may not be of the desired uniformity throughout the plasma chamber. For example, the plasma density may be greater near the internal antenna and may be reduced in regions away from the internal antenna.

This plasma non-uniformity may affect the extracted ion beam. For example, rather than extracting an ion beam having a constant ion density across its width, the ion beam may have a greater concentration of ions in a first portion, such as near the center, than a second portion, such as at its ends. In other embodiments, it may be desirable to create an ion beam having a known non-uniformity.

Therefore, it would be beneficial if there were an improved system for generating a plasma using a plasma chamber. More particularly, it would be advantageous to improve the plasma uniformity in plasma chambers where internal antennas are employed.

SUMMARY

A plasma chamber having improved control over plasma density is disclosed. The plasma chamber utilizes internal antennas. These internal antennas can be manipulated in a variety of ways to control the uniformity of the plasma density. In some embodiments, the conductive coil within the outer tube of the internal antenna is translated from a first location to a second location. This may be done in a plurality of ways. For example, the entirety of the sections of the internal antenna may be translated within the plasma chamber. In another embodiment, the conductive coil disposed within the internal antenna is translated relative to its outer tube. In another embodiment, the conductive coil within the outer tube may be bent and may be rotated within the outer tube. In another embodiment, the outer tube may also be bent and rotated.

In other embodiments, ferromagnetic segments may be disposed in the outer tube to manipulate the electromagnetic energy emitted from the conductive coil. Of course, more than one of these techniques may be employed simultaneously to achieve the desired uniformity.

According to a first embodiment, a plasma chamber is disclosed. The plasma chamber comprises an internal antenna, comprising a plurality of sections, each section comprising an outer tube and a conductive coil disposed within the outer tube; an RF power source coupled to the conductive coils; and an actuator to move the conductive coils from a first position to a second position within the plasma chamber. In one further embodiment, the outer tubes of the plurality of sections are linearly translated by the actuator. In another further embodiment, the conductive coils disposed within the outer tubes of the plurality of sections are linearly translated by the actuator without any movement of the outer tubes. In another further embodiment, the conductive coils of the plurality of sections are bent, and the conductive coils are rotated by the actuator. In another further embodiment, the conductive coils of the plurality of sections are bent, and the outer tubes are rotated by the actuator. In another further embodiment, the outer tubes and the conductive coils of the plurality of sections are both bent and the actuator rotates the outer tubes and the conductive coils.

According to a second embodiment, a plasma chamber is disclosed. This plasma chamber comprises an internal antenna, comprising a plurality of sections, each section comprising an outer tube, a conductive coil disposed within the outer tube, and a ferromagnetic segment disposed within the outer tube to manipulate emission from the conductive coil; an RF power source coupled to the conductive coils; a first actuator to move the conductive coils from a first position to a second position within the plasma chamber; and a second actuator to move the ferromagnetic segments within the outer tubes.

According to a third embodiment, a plasma chamber is disclosed. The plasma chamber comprises an internal antenna, comprising a plurality of sections, each section comprising an outer tube, a conductive coil disposed within the outer tube, and a ferromagnetic segment disposed within the outer tube to manipulate emission from the conductive coil; an RF power source coupled to the conductive coils; and an actuator to move the ferromagnetic segments within the outer tubes. In a further embodiment, the actuator rotates the ferromagnetic segments about the conductive coils. In another further embodiment, the actuator linearly translates the ferromagnetic segments in the outer tubes.

BRIEF DESCRIPTION OF THE FIGURES

For a better understanding of the present disclosure, reference is made to the accompanying drawings, which are incorporated herein by reference and in which:

FIGS. 2A-2B represent the plasma density for the embodiments of FIGS. 1A-1B, respectively;

DETAILED DESCRIPTION

A system of controlling plasma uniformity using internal antennas is disclosed. These internal antennas can be manipulated in a variety of ways to control the uniformity of the plasma density. For example, the conductive coil in the internal antenna may be translated from a first position to a second position within the plasma chamber to control the plasma uniformity. This may be performed in a number of different ways.

Figure 1A:
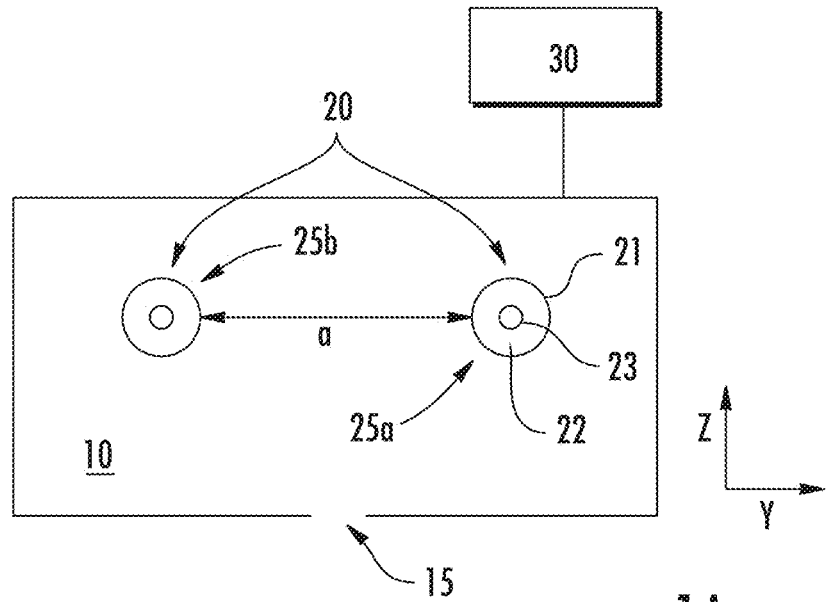
FIGS. 1A-1B show a first embodiment where the sections of the internal antenna are translated relative to one another to control the uniformity of the plasma density.
Figure 1B:
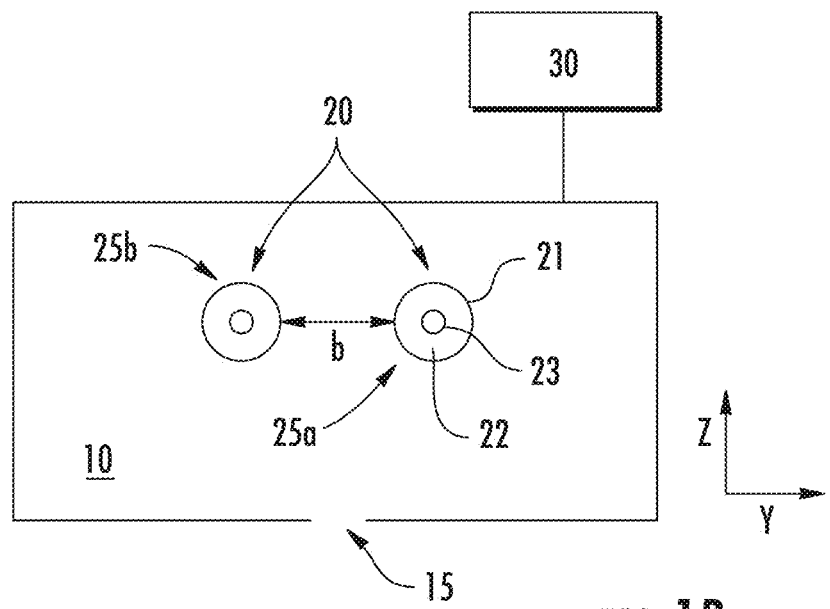

FIGS. 1A-1B show a first embodiment. An internal antenna 20 is disposed within a plasma chamber 10. The plasma chamber 10 and internal antenna 20 are shown in cross-section in the y-z plane. The plasma chamber 10 has one or more apertures 15 through which ions from the plasma may be extracted. The internal antenna 20 may include a first section 25a and a second section 25b, collectively referred to as sections 25a, 25b. While the figures illustrate two sections, the disclosure is not limited to this number. In all embodiments described herein, the internal antenna may include any number of sections. Thus, the internal antenna may comprise a plurality of sections.

Figure 5A:
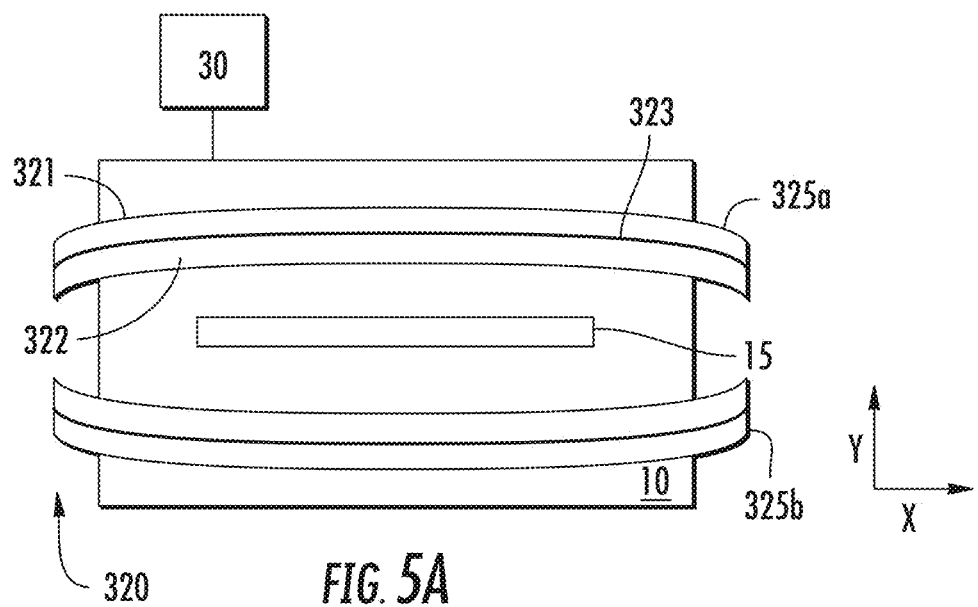
FIGS. 5A-5B show a fourth embodiment where the bent outer tubes of the internal antenna are rotated.
Figure 5B:
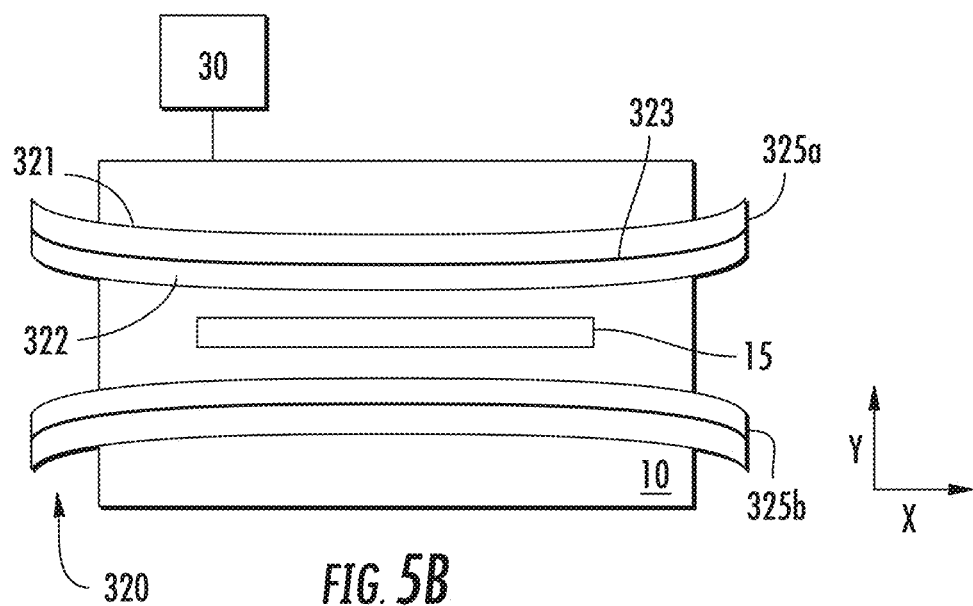

Each section 25a, 25b includes an outer tube 21, which is typically made of a dielectric material, such as quartz, although other materials may be used. Disposed inside the outer tube 21 is a conductive coil 23, which may be made of any conductive material, such as but not limited to metal. The space 22 between the conductive coil 23 and the outer tube 21 may be filled with a gas. In this embodiment, as illustrated in FIGS. 1A-1B, the outer tubes 21 may be cylindrical tubes, while the conductive coils 23 may be linear. However, in other embodiments, the outer tubes 21 may not be cylindrical. For example, they may be arcuate or bent, as shown in FIGS. 5A-5B, or any other shape. Similarly, the conductive coils 23 may also not be linear, and may be arcuate, as shown in FIG. 5A-5B, or any other shape.

Figure 8A:
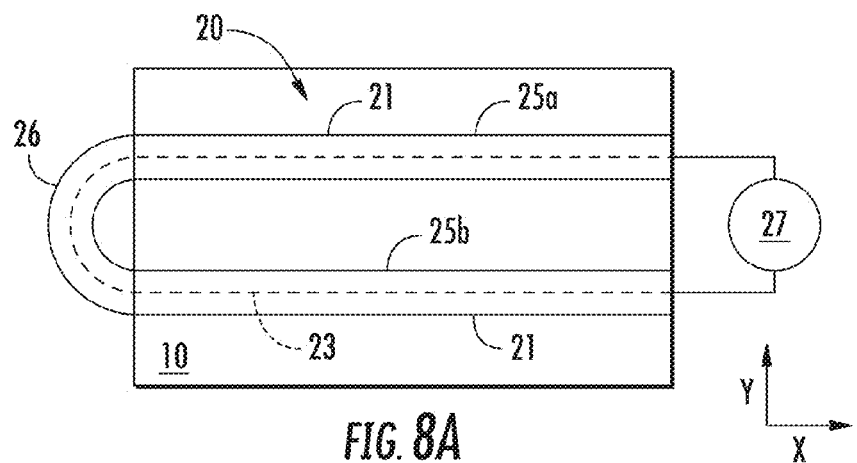
FIGS. 8A-8C show three embodiments for the configuration of the internal antenna.
Figure 8B:
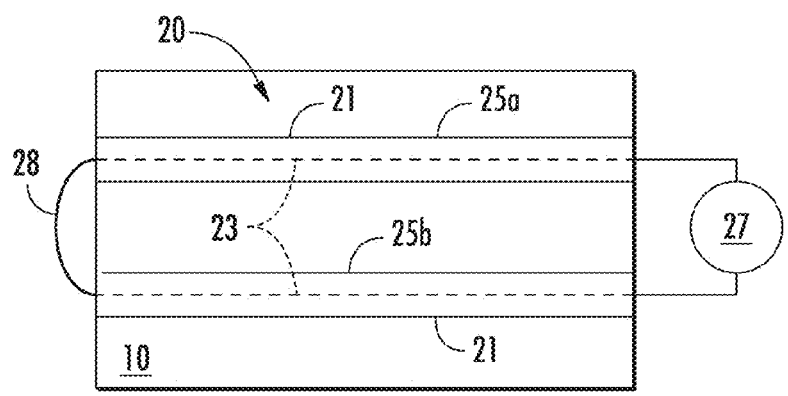
Figure 8C:
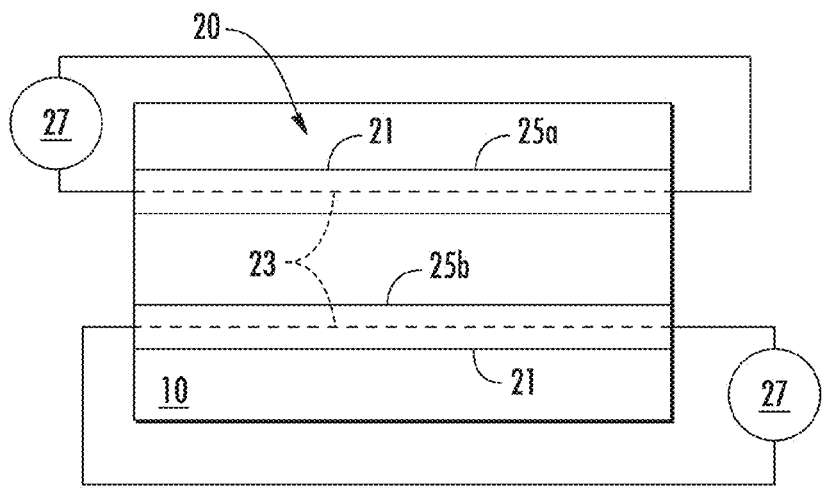

FIGS. 8A-8C shows the plasma chamber 10 in cross-section taken in the x-y plane, and illustrate several embodiments for connecting the sections 25a, 25b of the internal antenna 20 to an RF power source 27.

In FIG. 8A, the internal antenna 20 may be "U" shaped, such that the two sections 25a, 25b shown in FIG. 1A are actually part of the same component, which is simply bent 180°. This bend 26 may be disposed outside the plasma chamber 10. The conductive coil 23 passes through both sections 25a, 25b of the internal antenna 20 as well as the bend 26. The opposite ends of the conductive coil 23 may be connected to an RF power source 27.

In another embodiment, shown in FIG. 8B, there may be two sections 25a, 25b, each having a separate outer tube 21. Each section 25a, 25b may have a respective conductive coil 23. A separate conductor 28 may be used to connect one end of each of these conductive coils 23 together, effectively creating a single conductive coil. In this embodiment, conductor 28 between the two sections 25a, 25b may be flexible enough to allow respective movement between the two sections 25a, 25b. The connections between the conductive coils 23 and the conductor 28 may be made inside the plasma chamber 10, outside the plasma chamber 10, inside the outer tube 21 or outside the outer tube 21. In a related embodiment, a single conductive coil 23 may be disposed in both outer tubes 21. In this embodiment, the single conductive coil 23 may pass through first section 25a, exit through the side of the plasma chamber 10, and re-enter the plasma chamber 10, passing through the second section 25b. In both embodiments, the opposite ends of the conductive coil 23 may be connected to an RF power source 27.

In yet another embodiment, shown in FIG. 8C, the internal antenna 20 may be comprised of two completely separate sections 25a, 25b. FIG. 8C shows two separate sections 25a, 25b where the opposite ends of each conductive coil 23 are connected to a respective RF power source 27. The connections to the RF power source 27 may be made inside the plasma chamber 10, outside the plasma chamber 10, inside the outer tube 21 or outside the outer tube 21.

Furthermore, while FIGS. 8A-8B illustrate two sections 25a, 25b, the disclosure is not limited to this embodiment. The internal antenna 20 may be comprised of an arbitrary number of sections. This plurality of sections may be connected using any of the configurations shown in FIGS. 8A-8C.

Each end of the conductive coil 23 may be connected to a different voltage potential. For example, in one embodiment, shown in FIGS. 8A-8C, each end of the conductive coil 23 is connected to a terminal of the RF power source 27. In another embodiment, one end of the conductive coil 23 may be grounded, while the other end may be connected to a RF power source 27. This RF power source 27 may be an AC power supply. The current passing through the conductive coil 23 generates an electromagnetic field, which serves to create a plasma in the plasma chamber 10. In some embodiments, the frequency of the RF power source 27 may be varied to control the uniformity of the plasma density.

Additionally, any suitable species of feed gas may be introduced into the plasma chamber 10 to be energized by the internal antenna 20. The plasma chamber 10 may be kept at any suitable pressure, as the present disclosure is not limited to any particular configuration. Furthermore, the amplitude or frequency of the power signal created by the RF power source 27 is not limited. Furthermore, the plasma chamber 10 may operate in either inductively coupled plasma (ICP) mode or capacitively coupled plasma (CCP) mode.

In FIG. 1A, the two sections 25a, 25b are separated by a first distance "a". In some embodiments, the two sections 25a, 25b may be disposed within the plasma chamber 10 such that the aperture 15 is midway between the two sections 25a, 25b. However, in other embodiments, the aperture 15 may not be midway between the two sections 25a, 25b.

When a current is passed through the conductive coil 23, a magnetic field may be generated. This field energizes feed gas disposed within the plasma chamber 10, generating a plasma. FIG. 2A shows a representative profile of the plasma density of the plasma created by the internal antenna 20 having a gap "a" between the first section 25a and the second section 25b.

In FIG. 1B, the spacing between the first section 25a and the second section 25b is reduced to "b", where distance "b" is less than distance "a". FIG. 2B shows a representative profile of the plasma density of the plasma created by the internal antenna 20 of FIG. 1B. By moving the first section 25a closer to the second section 25b, the plasma density may change. For example, in FIG. 2A, the greatest plasma density may be found between the two sections 25a, 25b.

However, in FIG. 2B, the greatest plasma density may be found in a rectangular volume surrounding the two sections 25a, 25b.

The change in the gap between the two sections 25a, 25b may be achieved through the use of an actuator 30. The actuator 30 may move the first section 25a, the second section 25b, or both sections. In one embodiment, sliding connections are disposed on the inner walls of the plasma chamber 10. These sliding connections allow each section 25a, 25b of the internal antenna 20 to move along a predefined path, such as along a horizontal path or a vertical path. Of course, other methods of moving the two sections 25a, 25b may be used as well.

In addition, while FIGS. 1A-1B show the two sections 25a, 25b moving in a horizontal direction, the disclosure is not limited to this embodiment. For example, the two sections 25a, 25b may also be moved in the vertical direction, or in a combination of horizontal and vertical directions. Furthermore, the movement of the first section 25a may be independent of the second section 25b, if desired.

Therefore, linear movement of the outer tubes 21 is one mechanism that may be used to move the conductive coils 23 from a first position to a second position. In this embodiment, the conductive coil 23 maintains its position relative to the outer tube 21. Thus, movement of the outer tubes 21 causes a corresponding movement of the conductive coils 23.

Figure 3A:
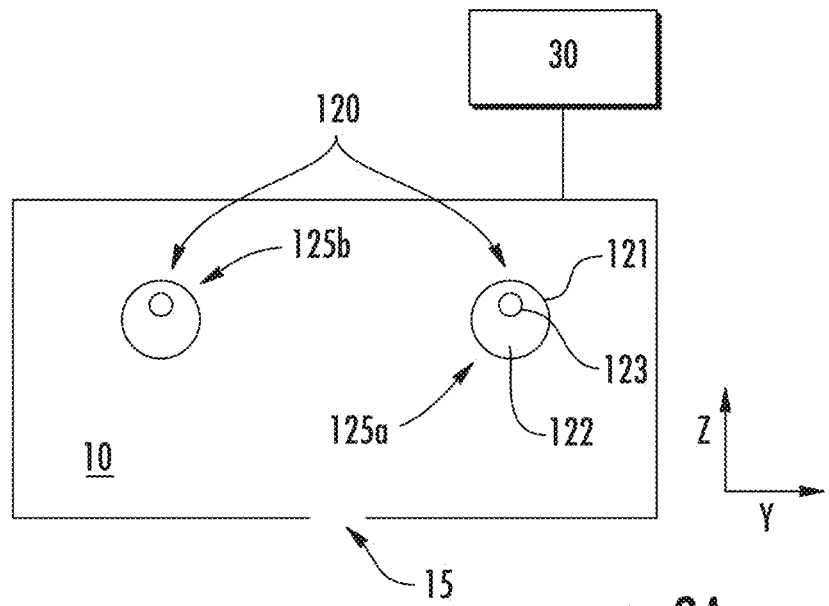
FIGS. 3A-3B show a second embodiment where the conductive coils in the internal antenna are translated relative to their respective outer tubes.
Figure 3B:
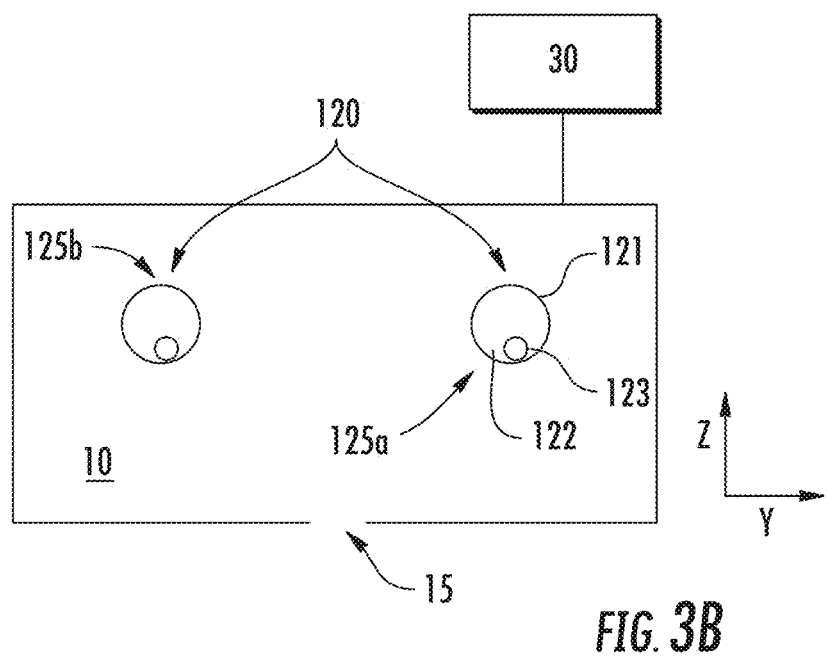

FIGS. 3A-3B show a second embodiment that may be used to control the uniformity of a plasma in a plasma chamber 10. The plasma chamber 10 and internal antenna 120 are shown in cross-section in the y-z plane. In this embodiment, as before, the internal antenna 120 may have two sections 125a, 125b. Each section 125a, 125b may include an outer tube 121, and a conductive coil 123 disposed in the outer tube 121. A gas may be disposed in the space 122 between the conductive coil 123 and the outer tube 121. Like the previous embodiment, the internal antenna 120 may have two sections 125a, 125b, which may be connected by a 180° bend 26 in the outer tube 121 (see FIG. 8A). As shown in FIG. 8A, the opposite ends of the conductive coil may be connected to a RF power source 27. In another embodiment, two separate outer tubes 121 may be used and a conductor 28 may be used to connect the conductive coils 123 of the two sections 125a, 125b (see FIG. 8B). As shown in FIG. 8B, the opposite ends of the conductive coil may be connected to a RF power source 27. In other embodiments, two separate outer tubes 121 may be used, with a single conductive coil 123 passing through two separate outer tubes 121. In other embodiments, the two sections 125a, 125b may be completely separate, with each electrically coupled to a respective RF power source 27 (see FIG. 8C).

FIGS. 3A-3B show the outer tubes 121 as cylindrical tubes with linear conductive coils 123 disposed therein. However, other shapes for the outer tubes 121 and the conductive coils 123 are also possible. In this embodiment, rather than causing the outer tubes 121 to move, only the conductive coils 123 disposed within the outer tubes 121 are translated. In other words, the outer tubes 121 remain fixed within the plasma chamber 10, while the conductive coil 123 is moved within the outer tube 121. FIG. 3A shows the conductive coils 123 in a first position, while FIG. 3B shows the conductive coils 123 in a second position. While FIGS. 3A-3B show the conductive coils 123 moving in a vertical direction, the disclosure is not limited to this embodiment. For example, the conductive coils 123 may also be moved in the horizontal direction, or in a combination of horizontal and vertical directions. For example, in another embodiment, the conductive coils 123 may be moved from a first position where the distance between the respective conductive coils 123 is minimized to a second position where the distance between the respective conductive coils 123 is maximized. This may mimic the configuration shown in FIGS. 1A-1B. The conductive coil 123 may be translated using an actuator 30, as described above.

Figure 4A:
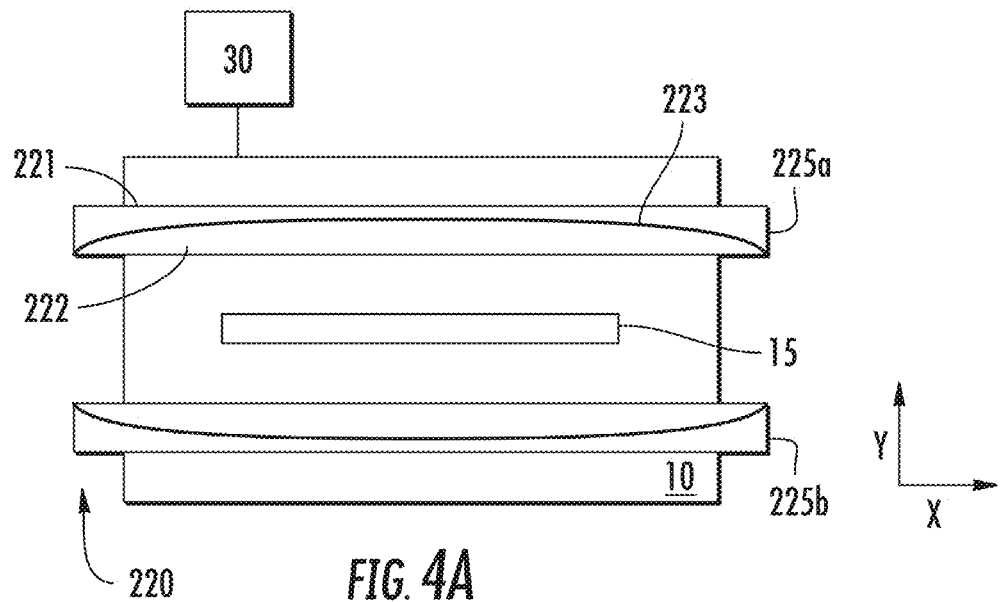
FIGS. 4A-4B show a third embodiment where the bent conductive coils in the internal antenna are rotated relative to their respective outer tubes.
Figure 4B:
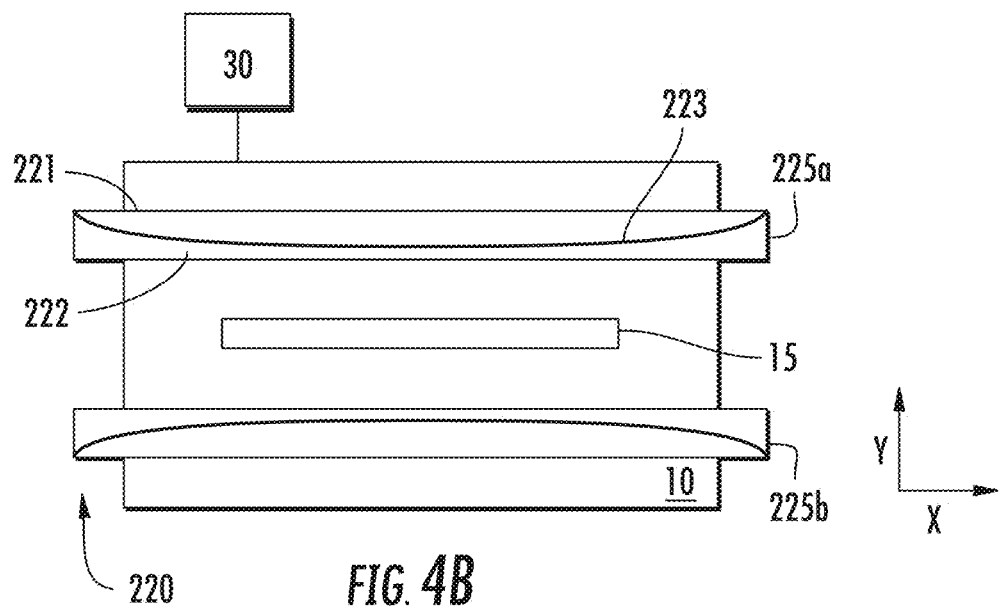

FIG. 4A-4B show a plasma chamber 10 and internal antenna 220 in cross-section in the x-y plane. In this view, the aperture 15 appears between the two sections 225a, 225b. In this embodiment, the conductive coils 223 are bent within the outer tubes 221. The outer tubes 221 may be cylindrical tubes with the bent conductive coil 223 disposed therein. The conductive coils 223 may be bent in a variety of ways. For example, FIG. 4A shows the bent conductive coils 223 disposed such that the ends of the conductive coils 223 are closer together than the middles of the respective conductive coils 223. This position of the bent conductive coils 223 may create more plasma density near the walls of the plasma chamber 10. The conductive coils 223 in FIG. 4A are shown to be arcuate in shape. However, any shape may be used. For example, the conductive coil 223 may comprise two straight segments that meet at an obtuse angle, resembling a "V" shape. As before, the space 222 between the conductive coil 223 and the outer tube 221 may be filled with a gas.

The two sections 225a, 225b may be configured in a number of ways. For example, in one embodiment, the two sections 225a, 225b may have a conductor 28 that connects the conductive coils 223 of both sections 225a, 225b, similar to the configuration shown in FIG. 8B. As shown in FIG. 8B, the opposite ends of the conductive coils may be connected to a RF power source 27. In this embodiment, the conductive coils 223 are electrically connected on one side of the plasma chamber 10 and electrically connected to the RF power source 27 on the other side of the plasma chamber 10. Such connections may be made inside the plasma chamber 10, outside the plasma chamber 10, inside the outer tubes 221 or outside the outer tubes 221.

In another embodiment, the two sections 225a, 225b may be completely separate, where the conductive coil 223 of each section 225a, 225b is connected to a respective RF power source 27, similar to the configuration shown in FIG. 8C.

FIG. 4B shows the bent conductive coil 223 of FIG. 4A rotated 180° such that the ends of the conductive coils 223 are farther apart than the middles of the respective conductive coils 223. This rotation may be achieved through the use of actuator 30. In one embodiment, the outer tube 221 remains stationary while the bent conductive coil 223 is rotated within the outer tube 221. In another embodiment, the entirety of sections 225a, 225b are rotated. In other words, the outer tube 221 is rotated and the conductive coil 223 disposed therein, which is fixed relative to the outer tube 221, is rotated as well by this action. Again, while an arcuate conductive coil 223 is shown in FIG. 4B, the bent conductive coil 223 may be any suitable shape. The term "bent" is used to denote that the conductive coil 223 is not straight.

FIG. 5A-5B show a fourth embodiment where a plasma chamber 10 and internal antenna 320 in cross-section in the x-y plane. In this view, the aperture 15 appears between the two sections 325a, 325b. In this embodiment, the conductive coils 323 and the outer tubes 321 are both bent. As before, a gas may fill the space 322 in the outer tubes 321. The bent outer tubes 321 are shown as being arcuate in shape, although other shapes may also be utilized. In addition, FIGS. 5A-5B show the outer tubes 321 having the same shape as the conductive coils 323. However, the disclosure is not limited to this embodiment.

FIG. 5A shows a configuration where the bent outer tubes 321 are disposed such that the distance between the middles of the two sections 325a, 325b is greater than the distance between the ends of the two sections 325a, 325b. This may have the same effect as the configuration shown in FIG. 4A.

In this embodiment, the entirety of sections 325a, 325b are rotated, such as to the position shown in FIG. 5B. This rotation may be accomplished using actuator 30 to rotate the outer tubes 321. Again, while an arcuate outer tube 321 is shown in FIG. 5B, the bent outer tube 321 may be any suitable shape. The term "bent" is used to denote that the outer tube 321 is not straight. Similarly, the conductive coil 323 may be arcuate, as shown in FIGS. 5A-5B or may be another shape.

The connections for the conductive coils 323 may be as described in FIGS. 8B-8C. In order to ensure rotation of the outer tube 321, it may be performed around a fixed circular window in the plasma chamber 10. The connection between the walls of the plasma chamber 10 and outer tube 321 may be sealed to allow antenna rotation while maintaining low gas pressure in the plasma chamber 10.

In all of the embodiments described herein, the actuator 30 may be pneumatic and computer controllable. The actuator 30 may allow linear motion of the sections 25a, 25b of the internal antenna, as shown in FIG. 1A-1B. In some embodiments, the actuator 30 allows linear movement of the conductive coil 123, as shown in FIG. 3A-3B. In some embodiments, the actuator 30 may also allow the rotation of the conductive coil 223 (as shown in FIG. 4A-4B). In some embodiments, the actuator 30 may allow rotation of the outer tube 321 (as shown in FIG. 5A-5B). In some embodiments, a single actuator may be able to achieve two or more of the movements described herein. For example, an actuator may allow linear and rotational movement. In other embodiments, two or more actuators 30 may be used to allow multiple movements.

The step size of the linear or rotational motion may be a fraction of a millimeter, although other step sizes are possible and within the scope of the disclosure. In addition, the actuation speed may be several millimeters per second, although other speeds are also possible. Furthermore, the actuator 30 may not be a stepper motor in some embodiments. In fact, any actuator that allows the movements described herein may be used.

Thus, the embodiments of FIGS. 1A-1B, 3A-3B, 4A-4B and 5A-5B all show a plasma chamber 10, having an internal antenna disposed therein. The internal antenna includes an outer tube, and a conductive coil disposed in the outer tube. In these embodiments, the internal antenna also comprises a plurality of sections, although the number of sections is not limited by the disclosure. In each of these embodiments, the conductive coils are moved from a first position to a second position so as to control the plasma uniformity within the plasma chamber 10. In some embodiments, the conductive coils move as a result of the movement of the outer tubes, such as in FIGS. 1A-1B and 5A-5B. In other embodiments, the conductive coils are moved independently of the outer tubes, such that the outer tubes 121 remains stationary. This includes the embodiment of FIGS. 3A-3B. The conductive coils 223 shown in the embodiment of FIG. 4A-4B may be rotated independently of the outer tubes 221, or may be moved as the outer tubes 221 are rotated. In some embodiments, the conductive coils are moved from a first position to a second position via linear translation, such as in FIGS. 1A-1B and 3A-3B. In other embodiments, the conductive coils are moved from a first position to a second position via rotation, such as in FIGS. 4A-4B and 5A-5B.

Additionally, these various embodiments may be combined. For example, the embodiments of FIGS. 1A-1B and 4A-4B may be combined such that the sections of the internal antenna may be linearly translated relative to one another and rotated as well. Other combinations of these embodiments are also possible and the disclosure is not limited to just this example.

These previous embodiments demonstrated the movement of the conductive coils from a first position to a second position as a way to control the plasma uniformity.

By moving the conductive coils from a first position to a second position, the plasma uniformity can be readily controlled. As shown in FIGS. 2A-2B, the lateral movement of the outer tubes 21 causes a change in the distribution of the plasma density. A similar effect occurs with the embodiments of FIGS. 3A-3B, 4A-4B and 5A-5B. The use of an actuator 30 allows the plasma uniformity of a plasma chamber 10 to be varied quickly, based on the requirements of the processing operation to be performed. Furthermore, use of an actuator 30 may allow the internal antenna to be adjusted in a minimum amount of time without manual intervention. Thus, one plasma chamber may be able to perform various processing operations that previously used different plasma chambers.

FIGS. 6A-6B and 7A-7B show another mechanism that may be used to control plasma uniformity. In these embodiments, ferromagnetic segments 440 are used to manipulate the magnetic fields emitted from the conductive coils 423. Thus, in lieu of, or in addition to, moving the conductive coils 423, the emission from the conductive coils 423 is blocked or focused.

Figure 6A:
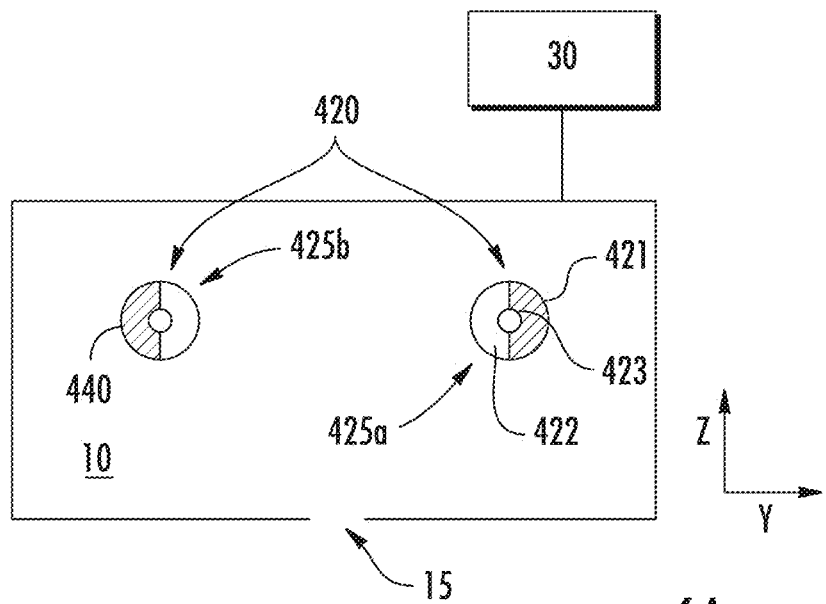
FIG. 6A-6B show a fifth embodiment where ferromagnetic segments are rotated within the outer tubes.
Figure 6B:
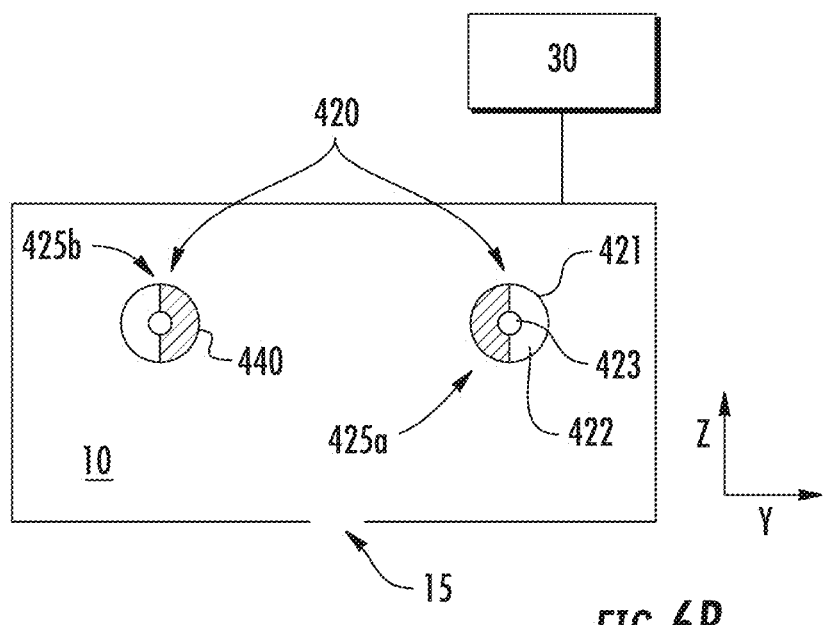

FIGS. 6A-6B show one embodiment. An internal antenna 420 is disposed within a plasma chamber 10. The plasma chamber 10 and internal antenna 420 are shown in cross-section in the y-z plane. The plasma chamber 10 has one or more apertures 15 through which ions from the plasma may be extracted. The internal antenna 420 may include two or more sections 425a, 425b. Each section 425a, 425b includes an outer tube 421, which is typically made of a dielectric material, such as quartz, although other materials may be used. Disposed inside the outer tube 421 is a conductive coil 423, which may be made of any conductive material, such as but not limited to metal. The space 422 between the conductive coil 423 and the outer tube 421 may be filled with a gas. Additionally, one or more ferromagnetic segments 440 are disposed in the outer tube 421. These ferromagnetic segments 440 may be "C" shaped, such that their outer and inner walls are arcuate so as to fit within the outer tube 421 and accommodate the conductive coil 423. In FIGS. 6A-6B, the ferromagnetic segments 440 are shown as being semi-circular (i.e. about 180°). However, other shapes are also possible. For example, the ferromagnetic segments 440 may be only a quarter circle or may be three quarters of a circle, if desired. Thus, the ferromagnetic segments 440 may be of any shape. In one embodiment, the ferromagnetic segments 440 may be the shape of a sector of a thick cylinder (or a plate), where inner radius will be slightly greater that radius of the conductive coil 423 and outer radius will be slightly smaller than the radius of outer tube 421. The thickness of the ferromagnetic segments 440 may vary and is not limited by this disclosure. Thus, the shape is not limited to any particular embodiment.

The ferromagnetic segments 440 may be comprised of annealed iron. They may be in direct contact with the conductive coil 423 and the outer tube 421. Moreover, that the ferromagnetic segments 440 may also serve as a bushing material inside the outer tube 421 to hold and fix the position of conductive coil 423.

FIG. 6A shows the ferromagnetic segments 440 disposed on the side of the conductive coil 423 that is distal from the aperture 15. This configuration may block the emission of energy toward the outer walls of the plasma chamber 10 and focus the energy toward the center of the plasma chamber 10. This configuration may create a denser plasma near the center of the plasma chamber 10.

FIG. 6B shows the ferromagnetic segments 440 disposed on the side of the conductive coil 423 that is proximate the aperture 15. This configuration may block the emission of energy toward the center of the plasma chamber 10 and focus the energy toward the outer walls of the plasma chamber 10. This configuration may create a denser plasma near the walls of the plasma chamber 10.

The ferromagnetic segments 440 may be moved from the first position shown in FIG. 6A to the second position shown in FIG. 6B through the use of actuator 30. This actuator 30 may cause the ferromagnetic segments 440 to rotate about the conductive coil 423. The actuator 30 may allow the ferromagnetic segments 440 to be disposed in any angular position in the outer tube 421. For example, the ferromagnetic segments 440 may be disposed in the outer tube 421 nearest the wall containing the aperture 15, or may be disposed in the outer tube 421 nearest the wall opposite the aperture 15, if desired.

Figure 7A:
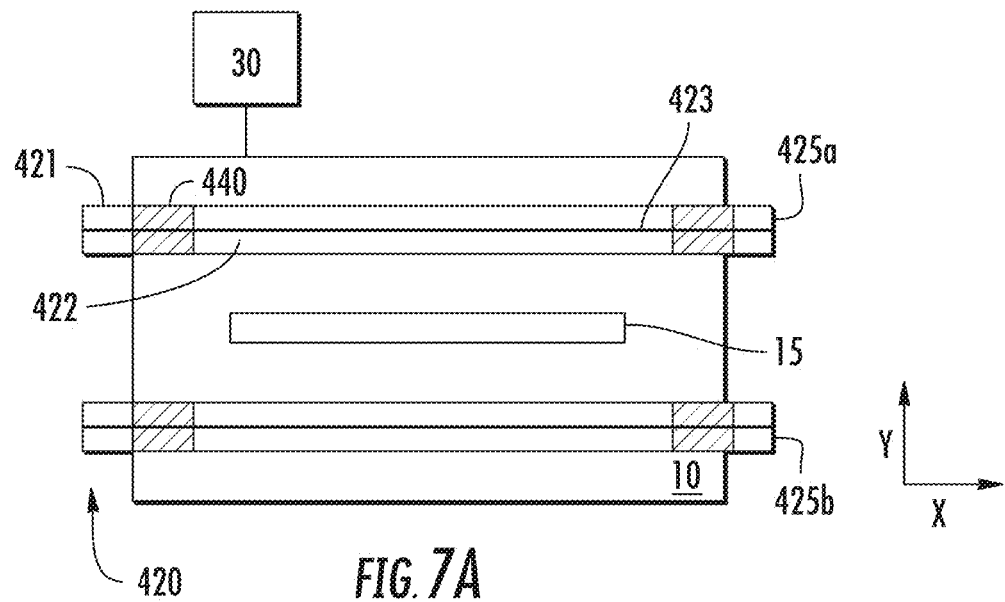
FIG. 7A-7B show a sixth embodiment where ferromagnetic segments are linearly translated within the outer tubes.
Figure 7B:
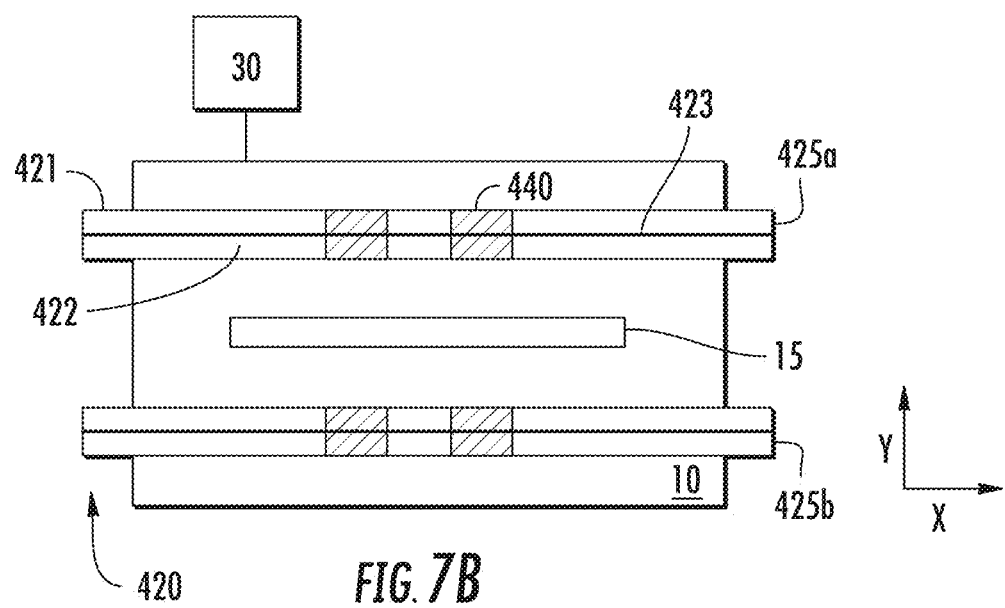

FIGS. 7A-7B also show the use of movable ferromagnetic segments 440. In this embodiment, rather than rotating the ferromagnetic segments 440 as was done in FIGS. 6A-6B, the ferromagnetic segments 440 are translated linearly. FIG. 7A shows two ferromagnetic segments 440 disposed near the ends of the outer tubes 421. This configuration may affect the energy near the sidewalls of the plasma chamber 10. In FIG. 7B, the two ferromagnetic segments 440 have been translated linearly toward the center of the plasma chamber 10. This configuration may affect the energy near the aperture 15. Actuator 30 may be used to move the ferromagnetic segments 440 from the first position (shown in FIG. 7A) to the second position (shown in FIG. 7B).

In one embodiment, these ferromagnetic segments 440 may have the same shape as those shown in FIGS. 6A-6B. In another embodiment, these ferromagnetic segments 440 may completely encircle the conductive coil 423, effectively blocking all energy in that vicinity.

In one embodiment, the embodiments of FIGS. 6A-6B and 7A-7B may be combined, such that the ferromagnetic segments 440 may be both rotated and linearly translated as desired.

The actuator 30 used to linearly translate and/or rotate the ferromagnetic segments 440 may be similar in design to that described above.

The ferromagnetic segments 440 shown in FIGS. 6A-6B and 7A-7B may be used to manipulate the emission from the conductive coil 423. In these regions where the ferromagnetic segment 440 is disposed between the conductive coil 423 and the outer tube 421, the emissions may be at least partially blocked or attenuated. Movement of the ferromagnetic segments 440, either rotationally or linearly, allows the ability to alter the plasma uniformity.

The use of ferromagnetic segments 440 may also be combined with one or more of the embodiments shown in FIGS. 1A-1B, 3A-3B, 4A-4B and 5A-5B. For example, the outer tubes may be moved (as shown in FIGS. 1A-1B) using a first actuator. In this configuration, a second actuator may be utilized to move the ferromagnetic segments 440 disposed in the outer tubes 421. In some embodiments, the same actuator may be used for both movements. Of course, the use of ferromagnetic segments 440 may also be combined with others of the embodiments described herein.

While each of the embodiments disclosed herein shows the use of an actuator 30, other embodiments exist where an actuator is not used. For example, in a variation of the embodiment of FIG. 1A-1B, the outer tubes 21 may be configured so as to be capable of being disposed in a plurality of locations along the wall of the plasma chamber 10. In this embodiment, the outer tubes 21 may be manually adjusted to achieve the desired plasma uniformity. This manual technique may also be applied to any of the other embodiments described herein.

Furthermore, the term plasma uniformity is not intended to depict that the plasma density is equal in all regions. Indeed, in some embodiments, it may be beneficial to have unequal plasma distribution. The embodiments described herein may be used to achieve an equal plasma density or any desired unequal plasma distribution.

Additionally, while all of the embodiments shown herein depict the internal antenna disposed parallel to the aperture 15, the disclosure is not limited to this embodiment. In certain embodiments, the internal antenna may be disposed perpendicular to the aperture 15, if desired.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

What is claimed is:

1. A plasma chamber, comprising:
   an internal antenna, comprising a plurality of sections, each section comprising:
      an outer tube; and
      a conductive coil disposed within the outer tube;
   an RF power source coupled to the conductive coils; and
   an actuator to move the conductive coils from a first position to a second position within the plasma chamber.

2. The plasma chamber of claim 1, wherein the outer tubes of the plurality of sections are linearly translated by the actuator.

3. The plasma chamber of claim 1, wherein the conductive coils disposed within the outer tubes of the plurality of sections are linearly translated by the actuator without any movement of the outer tubes.

4. The plasma chamber of claim 1, wherein the conductive coils of the plurality of sections are bent, and the conductive coils are rotated by the actuator.

5. The plasma chamber of claim 1, wherein the conductive coils of the plurality of sections are bent, and the outer tubes are rotated by the actuator.

6. The plasma chamber of claim 1, wherein the outer tubes and the conductive coils of the plurality of sections are both bent and the actuator rotates the outer tubes and the conductive coils.

7. The plasma chamber of claim 1, further comprising ferromagnetic segments disposed in the outer tubes of the plurality of sections to manipulate emission from the conductive coil.

8. The plasma chamber of claim 7, wherein the ferromagnetic segments are linearly translated in the outer tubes by an actuator.

9. The plasma chamber of claim 7, wherein the ferromagnetic segments are rotated about the conductive coils in the outer tubes by an actuator.

10. A plasma chamber, comprising:
   an internal antenna, comprising a plurality of sections, each section comprising:
      an outer tube;
      a conductive coil disposed within the outer tube; and
      a ferromagnetic segment disposed within the outer tube to manipulate emission from the conductive coil;
   an RF power source coupled to the conductive coils;
   a first actuator to move the conductive coils from a first position to a second position within the plasma chamber; and
   a second actuator to move the ferromagnetic segments within the outer tubes.

11. The plasma chamber of claim 10, wherein the second actuator rotates the ferromagnetic segments about the conductive coils.

12. The plasma chamber of claim 10, wherein the second actuator linearly translates the ferromagnetic segments in the outer tubes.

13. The plasma chamber of claim 10, wherein the first actuator linearly translates the outer tubes.

14. The plasma chamber of claim 10, wherein the first actuator rotates the outer tubes.

15. A plasma chamber, comprising:
   an internal antenna, comprising a plurality of sections, each section comprising:
      an outer tube;
      a conductive coil disposed within the outer tube; and
      a ferromagnetic segment disposed within the outer tube to manipulate emission from the conductive coil;
   an RF power source coupled to the conductive coils; and
   an actuator to move the ferromagnetic segments within the outer tubes.

16. The plasma chamber of claim 15, wherein the actuator rotates the ferromagnetic segments about the conductive coils.

17. The plasma chamber of claim 15, wherein the actuator linearly translates the ferromagnetic segments axially in the outer tubes.

18. The plasma chamber of claim 16, wherein the ferromagnetic segments comprise arcuate inner and outer walls so as to fit within the outer tube and accommodate the conductive coil, and wherein a shape of the ferromagnetic segments comprises a portion of a circle.

19. The plasma chamber of claim 18, wherein the portion is between a quarter circle and three quarters of a circle.

* * * * *